United States Patent
Zhang et al.

(10) Patent No.: US 9,431,386 B2
(45) Date of Patent: Aug. 30, 2016

(54) CURRENT SENSING OF EMITTER SENSE INSULATED-GATE BIPOLAR TRANSISTOR (IGBT)

(71) Applicant: Avago Technologies General IP (Singapore) Pte. Ltd., Singapore (SG)

(72) Inventors: Bin Zhang, Singapore (SG); Hock Tiong Kwa, Singapore (SG)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 119 days.

(21) Appl. No.: 14/285,222

(22) Filed: May 22, 2014

(65) Prior Publication Data

US 2015/0340355 A1    Nov. 26, 2015

(51) Int. Cl.
| | | |
|---|---|---|
| *H02H 3/08* | (2006.01) | |
| *H01L 27/02* | (2006.01) | |
| *H02H 3/20* | (2006.01) | |
| *G01R 31/02* | (2006.01) | |
| *G01R 19/00* | (2006.01) | |
| *H03K 17/082* | (2006.01) | |
| *H02H 9/02* | (2006.01) | |
| *H03K 19/00* | (2006.01) | |

(52) U.S. Cl.
CPC .......... *H01L 27/0251* (2013.01); *G01R 19/00* (2013.01); *G01R 31/025* (2013.01); *H02H 3/20* (2013.01); *H03K 17/0828* (2013.01); *H02H 9/025* (2013.01); *H03K 19/001* (2013.01); *H03K 2217/0027* (2013.01)

(58) Field of Classification Search
USPC ............................................... 361/93.7–93.9
See application file for complete search history.

(56) References Cited

U.S. PATENT DOCUMENTS

| | | | |
|---|---|---|---|
| 7,079,368 B2* | 7/2006 | Ishikawa | H03K 17/0822 361/93.1 |
| 9,013,850 B2* | 4/2015 | Hiyama | H03K 17/0828 361/93.7 |
| 2013/0057323 A1 | 3/2013 | Spini et al. | |
| 2014/0043867 A1 | 2/2014 | Sugawara et al. | |

OTHER PUBLICATIONS

"Single IGBT Gate Driver", available at http://www.onsemi.com/pub_link/Collateral/MC33153-D.PDF, Rev. 8, Semiconductor Components Industries, LLC, Aug. 2013, 14 pages.

* cited by examiner

*Primary Examiner* — Danny Nguyen

(57) ABSTRACT

A control circuit and method are disclosed for controlling a current sense Insulated-Gate Bipolar Transistor (IGBT). In particular, the current sense IGBT creates voltage spikes in a sense voltage as a result of normal switching operations. The control circuit creates a blank period so that the voltage spikes are ignored and false detections of short-circuit events are avoided.

20 Claims, 5 Drawing Sheets

CURRENT SENSING OF EMITTER SENSE INSULATED-GATE BIPOLAR TRANSISTOR (IGBT)

FIELD OF THE DISCLOSURE

The present disclosure is generally directed toward current sense (also known as emitter sense) Insulated-Gate Bipolar Transistors (IGBTs) and methods of operating the same.

BACKGROUND

The insulated-gate bipolar transistor (IGBT) is a three-terminal power semiconductor device primarily used as an electronic switch and in newer devices is noted for combining high efficiency and fast switching. The IGBT can be viewed as a device with Metal-Oxide-Semiconductor input characteristics and bipolar output characteristics that is a voltage-controlled bipolar device. In short, the IGBT is essentially a combination of a Power MOSFET and a Bipolar Junction Transistor (BJT). Specifically, the IGBT combines the simple gate-drive characteristics of Metal-Oxide-Semiconductor Field-Effect Transistors (MOSFETs) with the high-current and low-saturation-voltage capability of BJTs. The IGBT combines an isolated gate FET for the control input, and a bipolar power transistor as a switch, in a single device.

IGBTs are continuing to find new fields of application. In particular, IGBTs can be found in power electronics, such as Pulse Width Modulated (PWM) servo and three-phase drives requiring high dynamic range control and low noise. IGBTs are also found in Uninterruptible Power Supplies (UPSs), Switched-Mode Power Supplies (SMPS), and other power circuits in which high switch repetition rates are required. Further still, IGBTs can be used in resonant-mode converter circuits.

BRIEF DESCRIPTION OF THE DRAWINGS

The present disclosure is described in conjunction with the appended figures, which are not necessarily drawn to scale.

DETAILED DESCRIPTION

Various aspects of the present disclosure will be described herein with reference to drawings that are schematic illustrations of idealized configurations. It should be appreciated that while particular circuit configurations and circuit elements are described herein, embodiments of the present disclosure are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of the present disclosure.

Figure 1C:
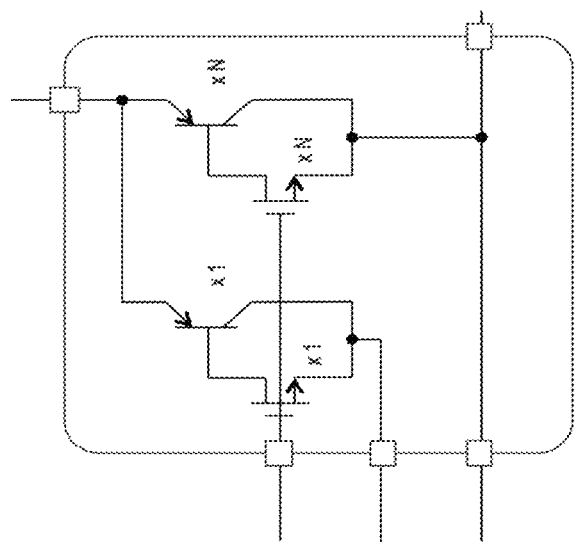
FIG. 1C is an equivalent circuit of a current sense IGBT.
Figure 1B:
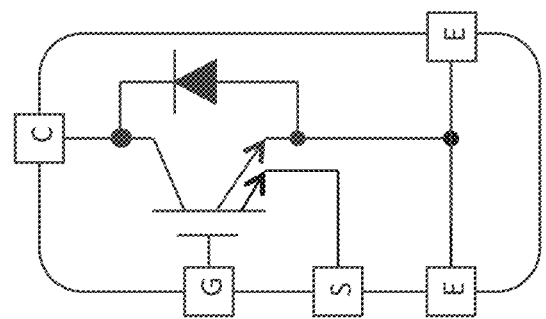
FIG. 1B depicts the pins of a current sense IGBT.
Figure 1A:
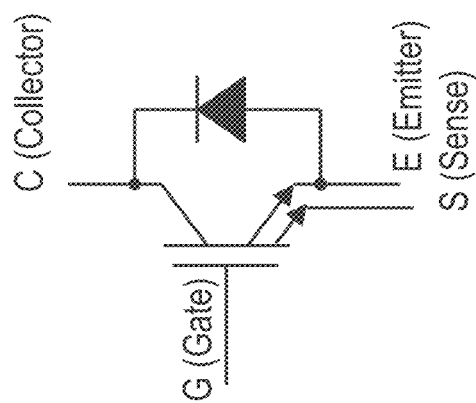
FIG. 1A is a symbolic representation of a current sense IGBT.

FIG. 1A depicts a typical current sense IGBT having a collector C, gate G, sense S, and emitter E. Functionally, the current sense IGBT includes a diode (or similar circuit element) positioned between the collector C and emitter E and across a BJT. As seen in FIG. 1B, the IGBT may comprise a pin for the collector C, a pin for the gate G, a pin for the sense S, and a pin for the emitter E.

FIG. 1C depicts the equivalent circuit of the current sense IGBT showing a first MOSFET (or similar circuit element) cascaded with a second MOSFET (or similar circuit element). The first MOSFET is shown as being positioned between the collector C, gate G, and sense S, whereas the second MOSFET is shown as being positioned between the collector C, gate G, and emitter E. As shown in FIG. 1C, the amount of current that flows from the collector C to the emitter E is N-times greater than the amount of current that flows from the collector C to the sense S. This enables a low-voltage control of the current sense IGBT via the sense pin even though a much larger current is flowing from the collector C to the emitter E. This particular feature makes the current sense IGBT ideal for high-power fields of application. In some embodiments, the current that flows from the collector C to the emitter E can be hundreds, thousands, or tens of thousands times greater than the current that flows from the collector C to the sense S. As such, the importance of protecting the IGBT from current surges (e.g., during a short-circuit event) is clear.

Figure 2B:
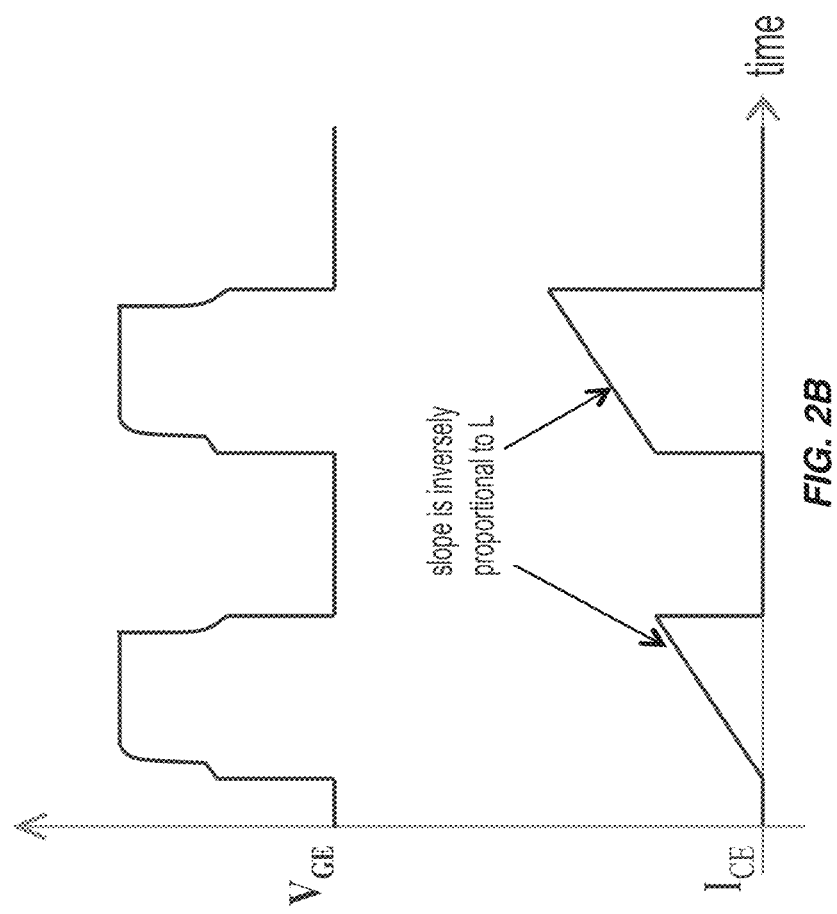
FIG. 2B depicts idealized voltage and current waveforms of the circuit depicted in FIG. 2A.
Figure 2A:
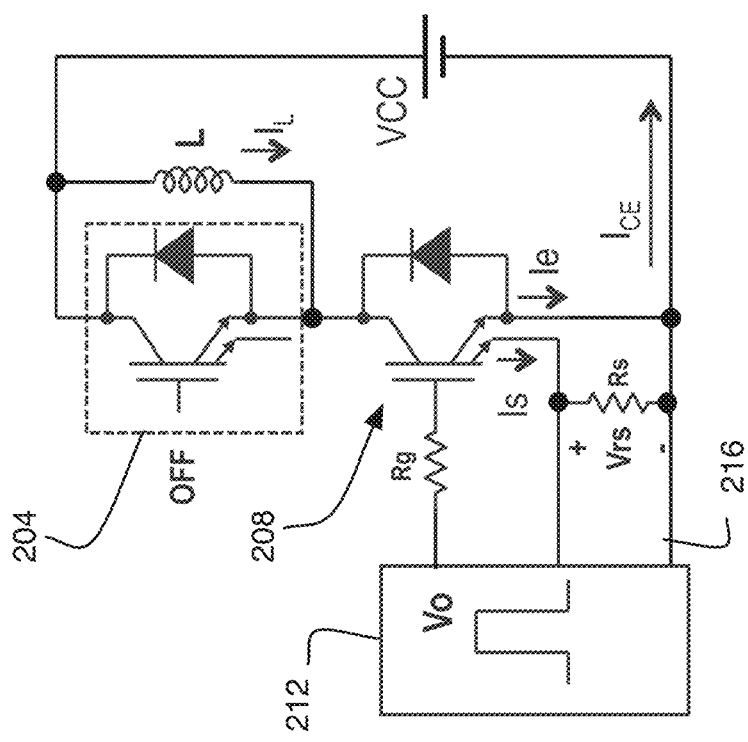
FIG. 2A is a circuit diagram depicting of a current sense IGBT driving an inductive load.

With reference now to FIGS. 2A and 2B, additional details of a current sense IGBT in operation will be described in accordance with embodiments of the present disclosure. While the following description may refer to a current sense IGBT generically as an IGBT, it should be appreciated that the terms current sense IGBT and IGBT are being used interchangeably to refer to the same components. Specifically, FIG. 2A depicts a circuit diagram whereby a first IGBT 204 and second IGBT 208 are being used to drive an inductive load L. In the depicted embodiment, a controller 212 is used to monitor current flowing through the second IGBT 208. Even more specifically, the controller 212 is shown to include a control output V0 that connects with the gate G of the second IGBT 208 via a gate resistor Rg. Two additional pins of the controller 212 are connected to the circuit across a sense resistor Rs that provides the controller 212 with a voltage reading across the sense resistor Vrs. In some embodiments, one of the two pins used for monitoring voltage Vrs is connected to ground whereas the other of the two pins used for monitoring voltage Vrs is connected to the sense S of the second IGBT 208. Advantageously, since the sense current Is emitted from the sense S of the second IGBT 208 is relatively small compared to the current flowing through the inductive load $I_L$, the controller 212 is not exposed to the type of current that would otherwise damage the controller 212. Instead, the controller 212 can monitor the voltage Vrs, which is a proportional fraction of the emitter current Ie flowing from the emitter E of the second IGBT (which is eventually equal to current $I_{CE}$), which could potentially damage the first IGBT 204 and/or second IGBT 208.

As a non-limiting example, the controller 212 may correspond to an Integrated Circuit (IC) chip, a microcontroller, an optocoupler with one or more integrated IC chips, an Application-Specific Integrated Circuit (ASIC), or the like that is programmed with logic that enables the controller 212 to detect a fraction of the IGBT current via the monitoring of the sense current Is and, in response to monitoring such current, determine how to control the second IGBT 208 with the control output V0. In some embodiments, the controller 212 is configured to detect faults or increases in voltage Vrs and, in response thereto, turn off the second IGBT 208 via an appropriate control signal provided to the gate G of the second IGBT 208.

As can be seen in FIG. 2B, the current flowing from the collector C to the emitter E ($I_{CE}$) of the second IGBT 208 has a slope that is ideally inversely proportional to the inductive load L. The current in sense pin, Is, is ideally a fraction of current in the main emitter, Ie, without distortion. Problematically, the mismatch between the sense and emitter characteristics (parasitic capacitance, inductances, turn-on threshold and etc) coupled with the high di/dt changes the response of the system. The result is that spikes of finite duration appear in sensed current, Is, during initial turn-on of IGBT as well as on voltage Vrs, which may cause false triggering at the controller 212. In other words, if the voltage spikes detected at voltage Vrs by controller 212 exceed a predetermined threshold, then the controller 212 will wrongly determine that a short-circuit event is occurring and will react accordingly, even though the voltage spike was artificially created and no short-circuit event actually occurred.

There have been attempts to solve this problem of false triggering. As one example, the introduction of a very large capacitor across the sense resistor Rs has been suggested. Unfortunately, by using a large capacitor filter and nothing else, a large time constant is introduced into the control-feedback loop, which causes slow response times during short-circuit events. Slow response times ultimately expose the IGBTs and the remainder of the circuitry to potentially damaging currents for prolonged periods of time.

Another suggestion has been to introduce an inductor between the sense S of the second IGBT 208 and the sense resistor Rs. Unfortunately, this particular solution relies on an inductor, which is sensitive to switching events and parasitic capacitance of IGBT. For this particular design to work, each inductor needs to be specially designed and selected gate-by-gate, which makes the implementation of the design almost unsuitable for large quantity manufacturing.

Figure 3B:
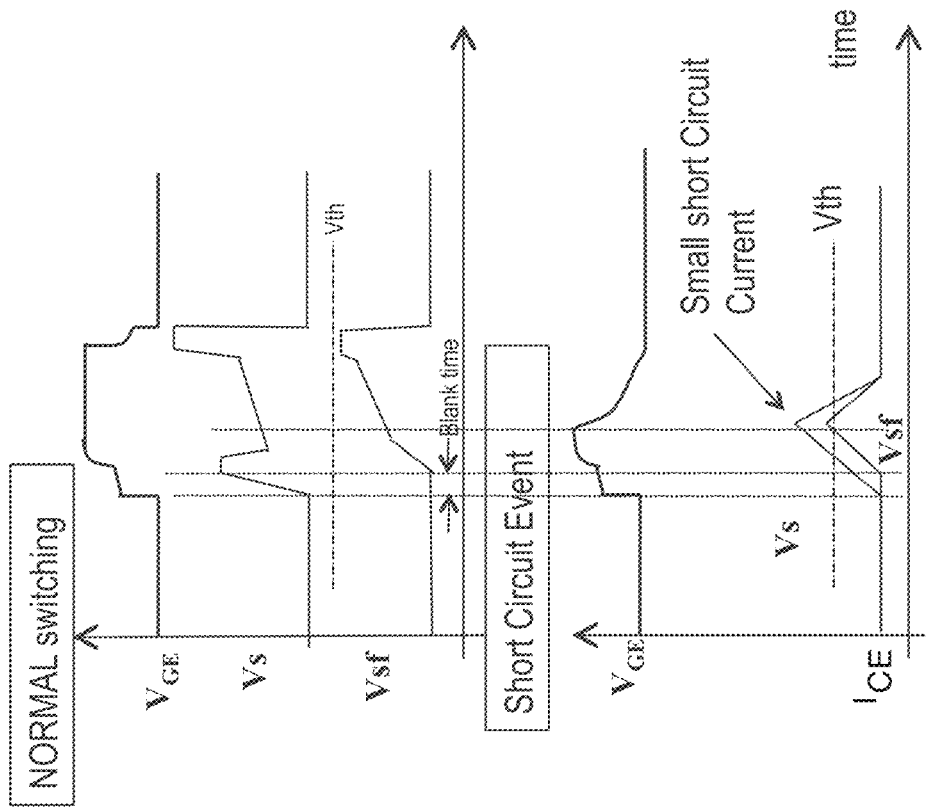
FIG. 3B depicts voltage and current waveforms of the circuit depicted in FIG. 3A.
Figure 3A:
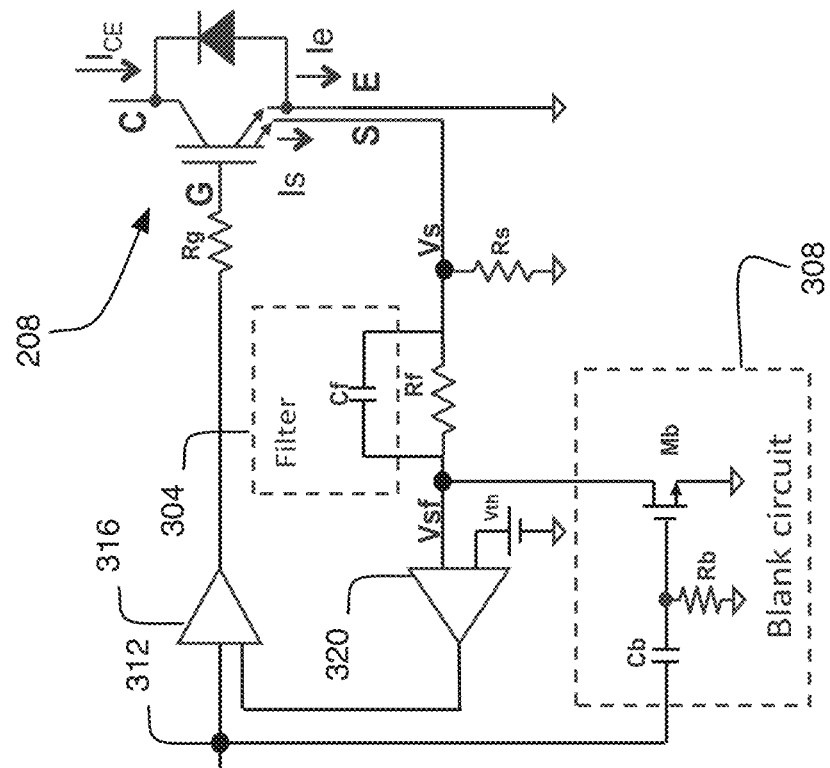
FIG. 3A is a circuit diagram depicting a first circuit configuration of a current sense IGBT driving an inductive load with a filter and blank circuit in accordance with embodiments of the present disclosure.

In response to these and other problems of the prior art, embodiments of the present disclosure introduce an alternative circuit arrangement in which the false triggering at the controller 212 is solved without unnecessarily exposing the circuitry and the IGBT to prolonged delays in response to short circuit event. In particular, and with reference now to FIGS. 3A and 3B, a first circuit configuration will be described in accordance with at least some embodiments of the present disclosure. In particular, FIG. 3A depicts a circuit configuration whereby a filter circuit 304 and blank circuit 308 are introduced between the IGBT 208 and the controller 212. It should be appreciated that some or all of the filter 304 and/or blank circuit 308 may be incorporated into a controller 212 or implemented separate from the controller 212. In the depicted example, a control node 312 corresponds to an input to a logic block 316 and the output of the logic block 316 may correspond to the control output Vo. In an alternative configuration, the control node 312 may correspond to the control output Vo and the logic block 316 may be external to the controller 212. Likewise, the voltage monitored by the controller 212 may be monitored across the sense resistor Rs (e.g., at voltage Vrs) or the voltage monitored by the controller 212 may be monitored across a different node of the circuit (e.g., a sense filter voltage Vsf).

In the depicted embodiment, the filter circuit 304 is positioned between the sense S pin and a sense comparator 320 (which may or may not be integrated into the controller 212). The voltage measured at the output of the filter 304 may correspond to a sense filter voltage Vsf that can be compared to a threshold voltage Vth to determine if a short-circuit event has occurred. In some embodiments, the threshold voltage Vth may be programmed into the controller 212 or it may be set by controlling the voltage provided to the sense comparator. Output of the sense comparator 320 may be provided as an input to the logic block 316 that ultimately turn off the IGBT 208 at the gate G.

In some embodiments, the blank circuit 308 is provided with a blanking MOSFET Mb, a blanking resistor Rb, and a blanking capacitor Cb. The components of the blank circuit 308 may remove the artificially-created spikes resulting from the high di/dt changes when the voltage gate-emitter $V_{GE}$ is rising. As can be seen in FIG. 3B, the blank circuit 308 may entirely remove the artificially-created spikes in the voltage Vs at the voltage Vsf, which are usually created at the rise of $V_{GE}$. The spikes in voltage Vs are essentially removed from the voltage Vsf by creating a blank time at every rise of $V_{GE}$ such that once the spike has subsided, the MOSFET Mb switches off and then allows the voltage Vsf to begin following the voltage Vs. Prior to switching states at the MOSFET Mb, however, the voltage Vsf is in the blank time and is not following the voltage Vs. Advantageously, the occurrence of false triggering at the controller 212 is greatly reduced.

After the blank time has elapsed, the voltage Vsf is allowed to begin following the voltage Vs. The filter circuit 304 enables the voltage Vsf to closely track the voltage Vs, especially during a short-circuit event. In other words, the filter components Cf is acting as high pass filter allowing transient current of Is to be sensed quickly by short circuit comparator 320. In particular, the slope of voltage Vsf is allowed to be essentially identical to the slope of voltage Vs after the blank time. As compared to prior designs, this allows the controller 212 to quickly detect the occurrence of a short-circuit event and react accordingly by adjusting the signal provided to the gate G of the IGBT 208. As an example, if the controller 212 detects the occurrence of a short-circuit event, the controller 212 may pull the gate-emitter voltage $V_{GE}$ low to avoid exposing the circuit or the IGBTs 208 to potentially damaging current.

Figure 4B:
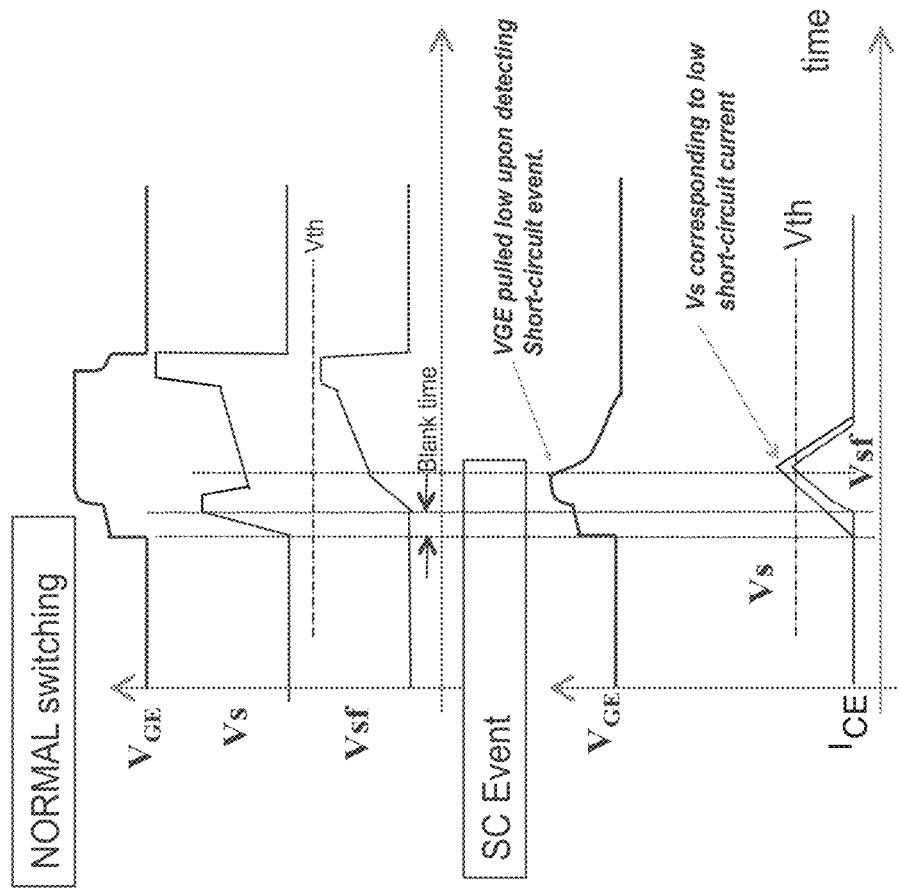
FIG. 4B depicts voltage and current waveforms of the circuit depicted in FIG. 4A.
Figure 4A:
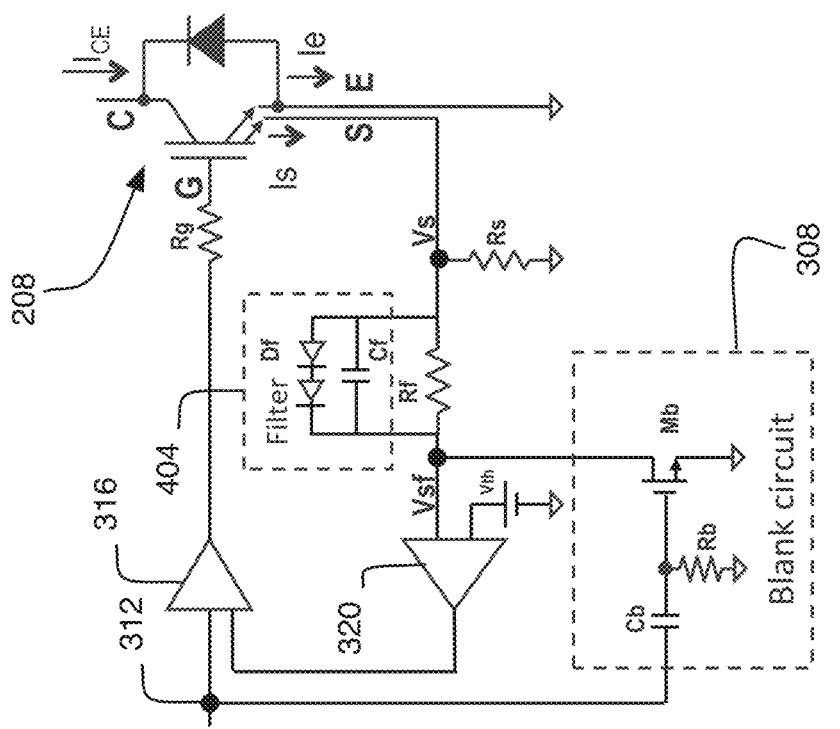
FIG. 4A is a circuit diagram depicting a second circuit configuration of a current sense IGBT driving an inductive load with a filter and blank circuit in accordance with embodiments of the present disclosure.

With reference now to FIGS. 4A and 4B, details of a second circuit configuration will be described in accordance with at least some embodiments of the present disclosure. The second circuit configuration is similar to the first circuit configuration in that a filter circuit 304 and a blank circuit 308 are used between the controller 212 and the IGBT 208. The blank circuit 308 of the second circuit configuration is similar or identical to the blank circuit 308 of the first circuit configuration.

The filter circuit 404, on the other hand, comprises one, two, three, four, or more diodes (or similarly-functional circuit elements) connected in parallel with the filter capacitor Cf and filter resistor Rf. The diodes of the filter circuit 404 enable the voltage Vsf to more closely follow voltage Vs. In particular, the filter diodes Df enable the slope of voltage Vsf to be greater than the slope of voltage Vs, thereby decreasing the response time between the end of the blank time and the potential detection of a short-circuit event (if such an event occurs). The blank circuit 308 behaves as discussed in connection with FIGS. 3A and 3B in that the blank circuit 308 creates the blank period. The filter circuit 404 provides the controller 212 with the ability to monitor a voltage Vsf that is rising faster than the voltage Vs. If the voltage Vsf is determined to exceed a threshold voltage Vth, then the controller 212 may determine that a short-circuit event has occurred and, in response thereto, the controller 212 may pull the voltage $V_{GE}$ low to protect the circuit and the IGBT 208 from damage.

As can be appreciated, the components of the circuits may be designed to support any application of field of use; however, for purposes of illustration only, possible sizes of the various circuit components will be described to assist in the understanding of the concepts described herein.

In a non-limiting embodiment, the sense resistor Rs may comprise a resistance between approximately 10 ohms and approximately 50 ohms or, more specifically, approximately 20 ohms. The filter circuit 404 may comprise a filter resistor Rf having a resistance between approximately 1,000 ohms and approximately 2,000 ohms or, more specifically, approximately 1,500 ohms; a filter capacitor Cf having a capacitance between approximately 1 nF and approximately 5 nF. The threshold voltage Vth may correspond to a voltage between approximately 0.25V and 1.0V or, more specifically, approximately 0.5V. The blank circuit 308 may comprise a blank resistor Rb with a resistance between approximately 25 ohms and approximately 75 ohms or, more specifically, approximately 50 ohms as well as a blank capacitor Cb having a capacitance between approximately 3 nF and approximately 6 nF or, more specifically, approximately 5 nF.

Figure 5:
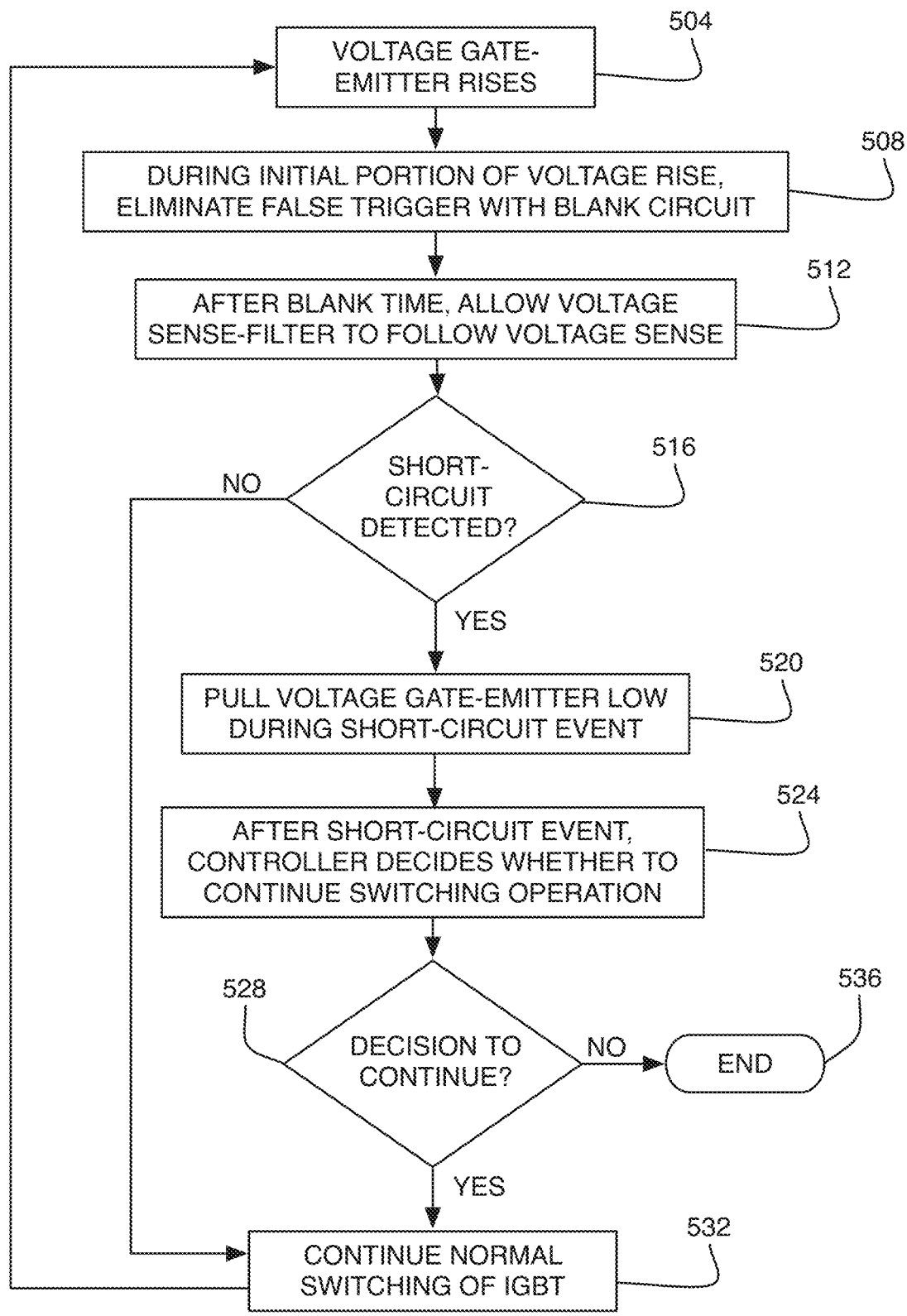
FIG. 5 is a flow diagram depicting a method of operating a current sense IGBT in accordance with embodiments of the present disclosure.

With reference now to FIG. 5, an illustrative method of operating a current sense IGBT such as that described in connection with FIGS. 3A, 3B, 4A, and/or 4B will be described in accordance with at least some embodiments of the present disclosure. The method begins when a voltage $V_{GE}$ begins rising at an IGBT (step 504). During the initial portion of the voltage rise, a blank circuit 308 is used to eliminate a false trigger (step 508). In some embodiments, the false trigger is eliminated by using a MOSFET in the blank circuit 308 to implement a blank time that causes voltage Vsf to not follow voltage Vs.

After the blank time has expired/elapsed, the method continues by allowing the voltage Vsf to begin following the voltage Vs (step 512). In some embodiments, a filter circuit 304, 404 is used to enable the voltage Vsf to quickly follow the voltage Vs. When the filter circuit 404 includes one or more filter diodes Df, the voltage Vsf may be allowed to rise more quickly than the voltage Vs, thereby enabling a quicker detection of possible short-circuit events.

Accordingly, the method continues with the controller 212 determining whether a short-circuit event has been detected (step 516). In some embodiments, a short-circuit event is detected by comparing voltage Vsf to a threshold voltage Vth either within the controller 212 or with one or more comparators that are external to controller 212.

If no short-circuit event is detected, then the method proceeds to step 532 where the normal switching of the IGBT is continued. On the other hand, if the controller 212 detects the existence of a short-circuit event, then the method proceeds with the controller 212 pulling the gate-emitter voltage $V_{GE}$ low during the short-circuit event (step 520). By pulling the gate-emitter voltage low, the controller 212 is able to protect the IGBT and other circuit components from unnecessary or prolonged exposure to uncontrolled currents, which could potentially damage such components. After the short-circuit event is done, the controller 212 implements logic to determine whether to continue the normal switching operation of the IGBT (steps 524, 528). If the query of step 528 is answered negatively, then the method ends (step 536). If the controller 212 determines that normal switching is allowed to continue, then the IGBT is allowed to return back to normal switching operations (step 532).

In the foregoing description, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor (GPU or CPU) or logic circuits programmed with the instructions to perform the methods (e.g., Application Specific Integrated Circuits (ASICs), Field-Programmable Gate Arrays (FPGAs), or the like).

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit adapted to sense one or more currents output by an Insulated-Gate Bipolar Transistor (IGBT), wherein the one or more currents output by the IGBT include a sense current and an emitter current, wherein the sense current corresponds to a fractional value of the emitter current, wherein the sense current flows through a sense resistor, thereby creating a sense voltage, the circuit comprising:
   a blank circuit that creates a blank period for a voltage being monitored in connection with the sense voltage, wherein the voltage being monitored is at a node connected to the sense resistor, wherein the blank period is created by the blank circuit pulling the voltage being monitored low, and wherein the blank period blanks out noise spikes created in the sense voltage by transients created in the IGBT during normal switching of the IGBT; and
   a filter circuit that enables the voltage being monitored in connection with the sense voltage to at least track the sense voltage after the blank period has ended.

2. The circuit of claim 1, wherein the filter circuit comprises a filter capacitor and a filter resistor connected in parallel that enable the voltage being monitored in connection with the sense voltage to at least have the same slope as the sense voltage after the blank period has ended.

3. The circuit of claim 2, wherein the filter circuit further comprises one or more filter diodes that enable the voltage being monitored in connection with the sense voltage to have a slope greater than a slope of the sense voltage after the blank period has ended.

4. The circuit of claim 1, wherein the blank circuit comprises at least one transistor.

5. The circuit of claim 4, wherein the blank circuit further comprises a blank resistor and a blank capacitor.

6. The circuit of claim 1, further comprising:
a sense comparator that compares the voltage being monitored in connection with the sense voltage with a threshold voltage.

7. The circuit of claim 6, wherein results of the comparison performed by the sense comparator are used to determine whether a short-circuit event has occurred for the IGBT.

8. The circuit of claim 7, further comprising a controller that is configured to pull a gate-emitter voltage of the IGBT low upon detecting an occurrence of the short-circuit event for the IGBT.

9. The circuit of claim 8, wherein the controller comprises the sense comparator and wherein the controller further comprises a logic block that turn off IGBT if short circuit event is sensed.

10. The circuit of claim 9, wherein both the sense comparator and the logic block are included in the controller.

11. The circuit of claim 8, wherein the controller comprises at least one of an Integrated Circuit (IC) chip, a microcontroller, and an optocoupler comprising a microcontroller.

12. A current sensing system, comprising:
an Insulated-Gate Bipolar Transistor (IGBT) comprising a collector, emitter, gate, and sense, wherein emitter current flows out of the emitter of the IGBT, wherein sense current flows out of the sense of the IGBT, wherein the sense current is a fractional value of the emitter current, and wherein the sense current flows through a sense resistor, thereby creating a sense voltage; and
a control circuit comprising a filter circuit and a blank circuit, the control circuit being configured to monitor the sense voltage with a sense filter voltage, wherein the blank circuit creates a blank period for the sense filter voltage, wherein the sense filter voltage is at a node connected to the sense resistor, wherein the blank period is created by the blank circuit pulling the sense filter voltage low, and wherein the blank period blanks out noise spikes created in the sense voltage by transients created in the IGBT during normal switching of the IGBT, and wherein the filter circuit enables the sense filter voltage to at least track the sense voltage after the blank period has ended.

13. The system of claim 12, wherein the control circuit further comprises a controller that is configured to detect a short-circuit event by comparing the sense filter voltage with a threshold voltage and, in response thereto, to pull a voltage at the gate of the IGBT to a low value.

14. The system of claim 13, wherein the controller comprises the blank circuit and wherein the blank circuit comprises at least one transistor that is in a first state during the blank period and switches to a second state at the end of the blank period, thereby enabling the sense filter voltage to begin at least tracking the sense voltage.

15. The system of claim 14, wherein the filter circuit comprises a filter capacitor and a filter resistor that are configured to enable the sense filter voltage to have a slope at least as large as a slope of the sense voltage.

16. The system of claim 15, wherein the filter capacitor and the filter resistor are connected in parallel with the sense resistor.

17. The system of claim 15, wherein the filter circuit further comprises at least one diode that is connected in parallel with the filter capacitor and the filter resistor.

18. The system of claim 13, wherein the emitter current is at least one hundred times larger than the sense current.

19. The system of claim 18, wherein the threshold voltage is no greater than 1.0V.

20. A control circuit for controlling a current sense Insulated-Gate Bipolar Transistor (IGBT), the control circuit comprising:
a blank circuit having a transistor, a resistor, and a capacitor that are configured to create a blank period during which a voltage being monitored in connection with a sense voltage of the IGBT blanks out transients created in the IGBT as a result of the IGBT switching, wherein the voltage being monitored in connection with the sense voltage is at a node connected to the resistor, and wherein the blank period is created by the blank circuit pulling the voltage being monitored low; and
a filter circuit having a filter resistor and a filter capacitor that are configured to enable the voltage being monitored in connection with the sense voltage to at least follow the sense voltage after the blank period has ended, but not before the blank period has ended.

* * * * *